United States Patent
Yamanaka (10) Patent No.: US 10,353,042 B2
(45) Date of Patent: Jul. 16, 2019

(54) MRI APPARATUS

(71) Applicant: TOSHIBA MEDICAL SYSTEMS CORPORATION, Otawara-Shi (JP)

(72) Inventor: Masaaki Yamanaka, Otawara (JP)

(73) Assignee: TOSHIBA MEDICAL SYSTEMS CORPORATION, Otawara-Shi (JP)

( * ) Notice: Subject to any disclaimer, the term of this patent is extended or adjusted under 35 U.S.C. 154(b) by 731 days.

(21) Appl. No.: 14/793,964

(22) Filed: Jul. 8, 2015

(65) Prior Publication Data

US 2016/0033609 A1 Feb. 4, 2016

(30) Foreign Application Priority Data

Jul. 31, 2014 (JP) .................. 2014-156067

(51) Int. Cl.
*G01R 33/565* (2006.01)
*G01R 33/36* (2006.01)
*G01R 33/58* (2006.01)

(52) U.S. Cl.
CPC ...... *G01R 33/5659* (2013.01); *G01R 33/3614* (2013.01); *G01R 33/3621* (2013.01); *G01R 33/583* (2013.01)

(58) Field of Classification Search
CPC ............ G01R 33/5659; G01R 33/3614; G01R 33/3621; G01R 33/583
USPC .................................................... 324/322
See application file for complete search history.

(56) References Cited

U.S. PATENT DOCUMENTS

2011/0109312 A1* 5/2011 Yamanaka ........... G01R 33/288
324/309
2013/0127467 A1* 5/2013 Yokoi .................... G01R 33/34
324/318

FOREIGN PATENT DOCUMENTS

| JP | 63-192428 | 8/1988 |
| JP | 6-319716 | 11/1994 |
| JP | 11-290288 | 10/1999 |
| JP | 2010-525855 | 7/2010 |

OTHER PUBLICATIONS

Office Action dated Mar. 6, 2018 in Japanese Patent Application No. 2014-156067.

* cited by examiner

*Primary Examiner* — Reena Aurora
(74) *Attorney, Agent, or Firm* — Oblon, McClelland, Maier & Neustadt, L.L.P.

(57) ABSTRACT

According to one embodiment, an MRI apparatus includes a generator, an amplifier, and processing circuitry. The generator sequentially generates RF pulses comprising an RF pulse train defined in a pulse sequence. The amplifier amplifies the RF pulses sequentially inputted from the generator. The processing circuitry calculates a correction value, each time an amplified RF pulse is outputted from the amplifier, based on a difference between an output value of the amplified RF pulse and a reference output value. Further, the processing circuitry applies the correction value promptly to an RF pulse to be inputted to the amplifier, the RF pulse to be inputted to the amplifier being included in the RF pulse train and being generated after an RF pulse corresponding to the amplified RF pulse used for calculation of the correction value is generated.

17 Claims, 7 Drawing Sheets

| TYPE OF RF PULSE | CORRECTION VALUE DURING CALIBRATION | CORRECTION VALUE DURING OPERATION |
|---|---|---|
| 90° PULSE | 0.9 | 0.8 |
| 180° PULSE | 1.2 | 1.8 |
| α° PULSE | 1.1 | 1.3 |
| ⋮ | ⋮ | ⋮ |

FIG. 7

MRI APPARATUS

CROSS-REFERENCE TO RELATED APPLICATIONS

This application claims the benefit of priority of Japanese Patent Application No. 2014-156067, filed on Jul. 31, 2014, the entire contents of which are incorporated herein by reference.

FIELD

Embodiments described herein relate generally to an MRI (Magnetic Resonance Imaging) apparatus.

BACKGROUND

An MRI apparatus is an imaging apparatus which excites nuclear spin of an object placed in a static magnetic field with an RF (Radio Frequency) pulse having the Larmor frequency and reconstructs an image based on MR (Magnetic Resonance) signals generated due to the excitation. An RF pulse changes the rotational directions of nuclear spins of atoms which are aligned into one direction by the static magnetic field (hereinafter, the tilt angle of the rotational axis of the nuclear spin caused by an RF pulse is referred to as a flip angle). The MR signals are generated when excited nuclear spins of an object recover. Thus, an RF pulse, whose intensity gives an intended flip angle, is transmitted in order to excite nuclear spins of an object in an MRI apparatus. This flip angle is one of parameters having influence on image quality, and necessary RF pulse intensity varies depending on, for example, positional relationship between an object and an RF coil etc.

However, output level of RF pulses fluctuates, because it is influenced by gain fluctuation of an amplifier which amplifies RF pulses.

For example, gain of an RF amplifier is influenced by temperature variation. Therefore, an MRI apparatus includes a feedback control mechanism adjusting its temperature by air cooling or water cooling when the temperature of the MRI apparatus increases or decreases by a predetermined value or rate. However, this feedback control mechanism works when the temperature exceeds a predetermined threshold value. The temperature inside the MRI apparatus therefore fluctuates between an upper limit value and a lower limit value each of which is determined as the predetermined threshold value. Although gain adjustment is performed inside the RF amplifier based on difference between its output level and input level, this control is also influenced in synchronization with the temperature fluctuation of the RF amplifier. Thus, RF pulse intensity, which is the final output of the RF amplifier, fluctuates depending on its temperature.

As mentioned above, RF pulse intensity fluctuates moment by moment during implementation term of a scan. In recent years, various imaging protocols are available. When imaging time becomes long, instability of RF pulse intensity due to the above-mentioned temperature variation influences image quality and becomes a factor of artifact.

For the above reasons, an MRI apparatus capable of outputting an RF pulse with intended intensity has been desired.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Hereinbelow, a description will be given of an MRI apparatus according to embodiments of the present invention with reference to the drawings.

In general, according to one embodiment, an MRI apparatus includes a generator, an amplifier, and processing circuitry. The generator sequentially generates RF pulses comprising an RF pulse train defined in a pulse sequence. The amplifier amplifies the RF pulses sequentially inputted from the generator. The processing circuitry calculates a correction value, each time an amplified RF pulse is outputted from the amplifier, based on a difference between an output value of the amplified RF pulse and a reference output value. Further, the processing circuitry applies the correction value promptly to an RF pulse to be inputted to the amplifier, the RF pulse to be inputted to the amplifier being included in the RF pulse train and being generated after an RF pulse corresponding to the amplified RF pulse used for calculation of the correction value is generated.

(1) Configuration

Figure 1:
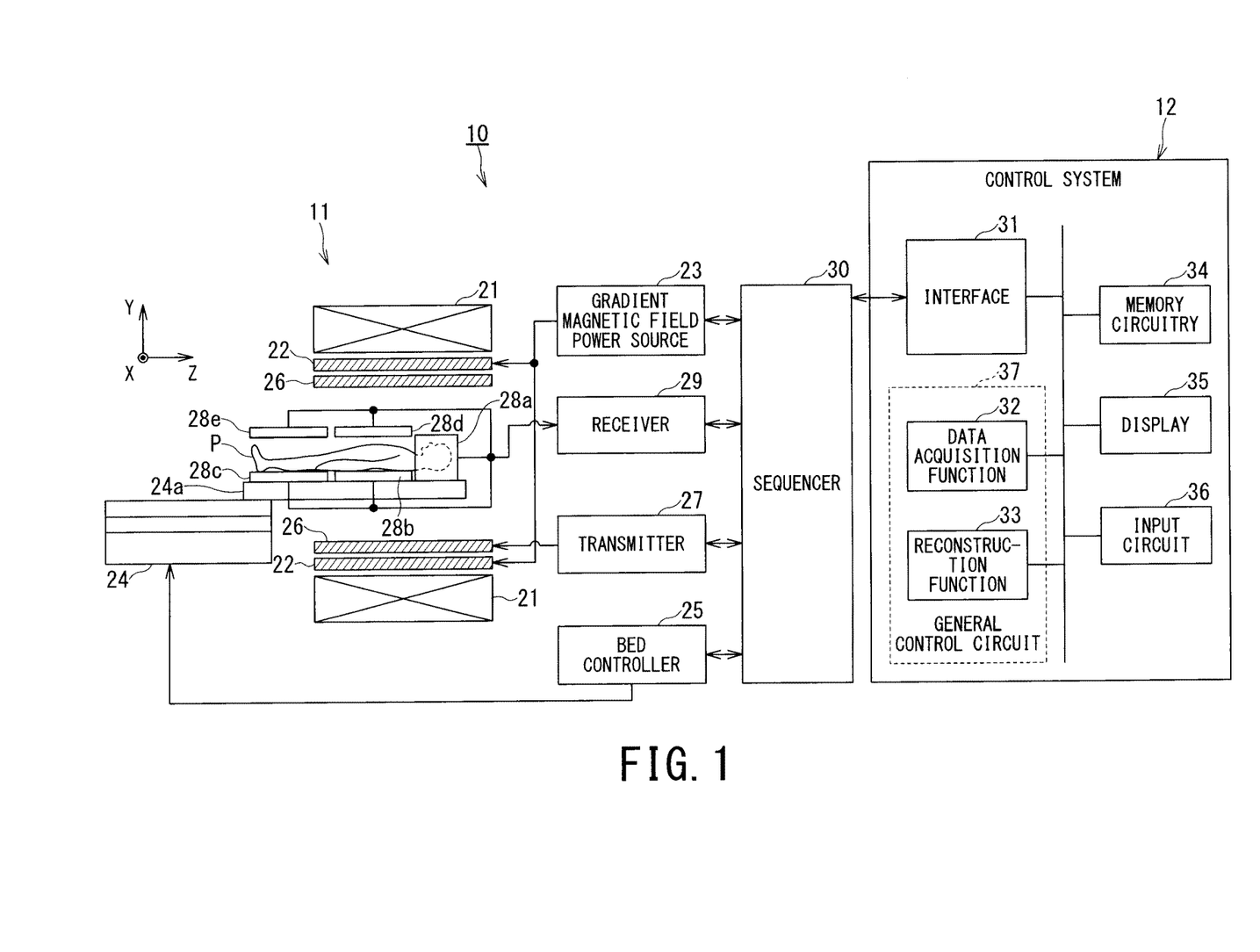
FIG. 1 is a conceptual configuration diagram showing an example of an MRI apparatus of embodiments of the present disclosure.

FIG. 1 is a schematic diagram showing hardware configuration of the MRI apparatus of embodiments of the present disclosure. The components of the MRI apparatus 10 shown in FIG. 1 can be roughly classified into an imaging system 11 and a control system 12.

The imaging system 11 includes a static magnetic field magnet 21, a gradient magnetic field coil 22, a gradient magnetic field power source 23, a bed 24, a bed controller 25, a transmission coil 26, a transmitter 27, reception coils 28a, 28b, 28c, 28d, and 28e, a receiver 29, and a sequencer (sequence controller) 30.

The static magnetic field magnet 21 is formed in a hollow cylinder shape at the outermost part of a non-illustrated gantry and generates a uniform static magnetic field in its internal space. As the static magnetic field magnet 21, for example, a permanent magnet, a superconductive magnet or the like is used.

The gradient magnetic field coil 22 is formed in a hollow cylinder shape and coaxially arranged inside the static magnetic field magnet 21. The gradient magnetic field coil 22 is configured by combining three coils which respectively correspond to the mutually orthogonal X, Y, and Z axes. Each of these three coils is supplied with an electric current from the gradient magnetic field power source 23 and generates a gradient magnetic field whose magnetic field intensity varies along the X, Y, or Z axis.

The Z axis direction is assumed to be the same direction as the application direction of the static magnetic field. The gradient magnetic field power source 23 supplies electric currents to the gradient magnetic field coil 22, on the basis of pulse-sequence execution data transmitted from the sequencer 30.

Here, the gradient magnetic fields generated by the gradient magnetic field coil 22 includes a readout gradient magnetic field Gr, a phase encode gradient magnetic field Ge, and a slice selection gradient magnetic field Gs. The readout gradient magnetic field Gr is used for changing frequency of an MR signal depending on a spatial position. The phase encode gradient magnetic field Ge is used for changing phase of an MR signal depending on a spatial position. The slice selection gradient magnetic field Gs is used for arbitrarily determining an imaging cross-section.

For example, in the case of acquiring a slice of an axial cross-section, the sequencer 30 controls the gradient magnetic field coil 22 and gradient magnetic field power source 23 so that the X, Y, and Z axes shown in FIG. 1 respectively correspond to the readout gradient magnetic field Gr, the phase encode gradient magnetic field Ge, and the slice selection gradient magnetic field Gs.

The bed 24 includes a table 24a on which an object P is loaded. The bed 24 inserts the table 24a with the object P loaded thereon into inside of the bore (imaging space) of the gradient magnetic field coil 22, under the control of the bed controller 25 described below. In general, this bed 24 is installed in such a manner that its longitudinal direction is in parallel with the central axis of the static magnetic field magnet 21.

The bed controller 25 moves the table 24a in its longitudinal direction and in the up-and-down direction, by driving the bed 24, under the control of the sequencer 30.

The transmission coil 26 is coaxially arranged inside the gradient magnetic field coil 22 and is supplied with RF (radio Frequency) signals so as to generate RF magnetic fields. The transmission coil 26 is also used as a reception coil and is also referred to as a whole body coil.

The transmitter 27 transmits an RF pulse corresponding to the Larmor frequency to the transmission coil 26, on the basis of the pulse-sequence execution data transmitted from the sequencer 30. The configuration of the transmitter 27 will be described below.

The reception coils 28a to 28e are disposed inside the gradient magnetic field coil 22 and detect MR signals emitted from the object P in response to the transmitted RF pulses. Here, each of the reception coils 28a to 28e is an array coil which has a plurality of coil elements configured to detect MR signals emitted from the object P. If an MR signal is detected by each coil element, each of the reception coils 28a to 28e outputs the detected MR signal to the receiver 29.

The reception coil 28a is a coil for the head part to be mounted on the head part of the object P. The reception coils 28b and 28c are coils for the spine to be disposed between the table 24a and the back of the object P. In addition, the reception coils 28d and 28e are coils for the abdominal part to be mounted on the abdominal side of the object P. Moreover, the MRI apparatus 10 may include a dual-purpose coil which can transmit RF pulses and detect MR signals.

The receiver 29 generates MR signal data on the basis of MR signals outputted from the reception coils 28a to 28e, in accordance with the pulse-sequence execution data transmitted from the sequencer 30. Further, the receiver 29 transmits the generated MR signal data to the control system 12 via the sequencer 30 after generating the MR signal data.

The receiver 29 has a plurality of reception channels for receiving MR signals outputted from the plurality of coil elements included in each of the reception coils 28a to 28e. When information on the coil elements selected for imaging is informed from the control system 12 to the receiver 29, the receiver 29 allocates reception channels to the selected coil elements so as to receive MR signals detected and outputted from the selected coil elements.

The sequencer 30 is connected to the gradient magnetic field power source 23, the bed controller 25, the transmitter 27, the receiver 29, and the control system 12. The sequencer 30 includes a processor. More concretely, sequencer 30 includes, for example, a CPU (central processing unit) and memory circuitry. The sequencer 30 stores control information necessary for driving the gradient magnetic field power source 23, the bed controller 25, the transmitter 27, and the receiver 29. For example, the sequencer 30 stores pulse-sequence execution data describing operation control information such as intensity, application period, and application timing of the pulse electric currents which should be applied to the gradient magnetic field power source 23, and so on.

In addition, the sequencer 30 moves the table 24a into and out of the gantry in the Z axis direction, by driving the bed controller 25 in accordance with the stored predetermined pulse-sequence execution data. Moreover, the sequencer 30 generates the X axis gradient magnetic field Gx, the Y axis gradient magnetic field Gy, the Z axis gradient magnetic field Gz, and RF pulses in the gantry, by driving the gradient magnetic field power source 23, the transmitter 27, and the receiver 29 in accordance with the stored predetermined pulse-sequence execution data.

The control system 12 performs overall control of the MRI apparatus 10, data acquisition, image reconstruction, and so on. The control system 12 includes an interface 31, memory circuitry 34, a display 35, an input circuit 36, and a general control circuit 37 which has a data acquisition function 32 and a reconstruction function 33. The general control circuit 37 includes at least one processor, and achieves its data acquisition function 32 and reconstruction function 33 by making the processor execute programs stored in the memory circuitry 34.

The interface 31 is connected to the gradient magnetic field power source 23, the bed controller 25, the transmitter 27, and the receiver 29 of the imaging system 11 via the sequencer 30. The interface 31 controls input/output of signals transmitted and received between these respective components connected thereto and the control system 12.

The data acquisition function 32 acquires the MR signal data transmitted from the receiver 29 via the interface 31. After acquiring the MR signal data, the data acquisition function 32 stores the acquired MR signal data in the memory circuitry 34.

The reconstruction function 33 generates image data or spectrum data of intended nuclear spin inside the object P, by performing post-processing (i.e. reconstruction processing such as Fourier transformation etc.) on the MR signal data stored in the memory circuitry 34.

In addition, when imaging of scout images is performed, the reconstruction function 33 generates profile data for each coil element based on the MR signals detected by the corresponding coil element included in each of the reception coils 28a to 28e. The above profile data are data indicative of distribution of the MR signals in the alignment direction of the coil elements. Afterward, the reconstruction function 33 stores the generated various types of data in the memory circuitry 34.

The memory circuitry 34 stores the MR signal data acquired by the data acquisition function 32, the image data generated by the reconstruction function 33, etc. for each object P.

The display 35 displays various types of information such as the image data and the spectrum data generated by the reconstruction function 33 or the like. As the display 35, a display device such as a liquid crystal display etc. can be used.

The input circuit 36 receives various information on imaging and various commands inputted by an operator and outputs to the general control circuit 37 an operation input signal corresponding to the operation by the operator. As the input circuit 36, a pointing device such as a mouse, trackball, etc., a selection device such as a mode-switching switch etc., or an input device such as a keyboard etc. can be appropriately used.

The general control circuit 37 includes a processor and memory circuitry, controls the above-mentioned respective components by executing programs stored in the memory circuitry, thereby generally controlling the MRI apparatus 10.

Figure 2:
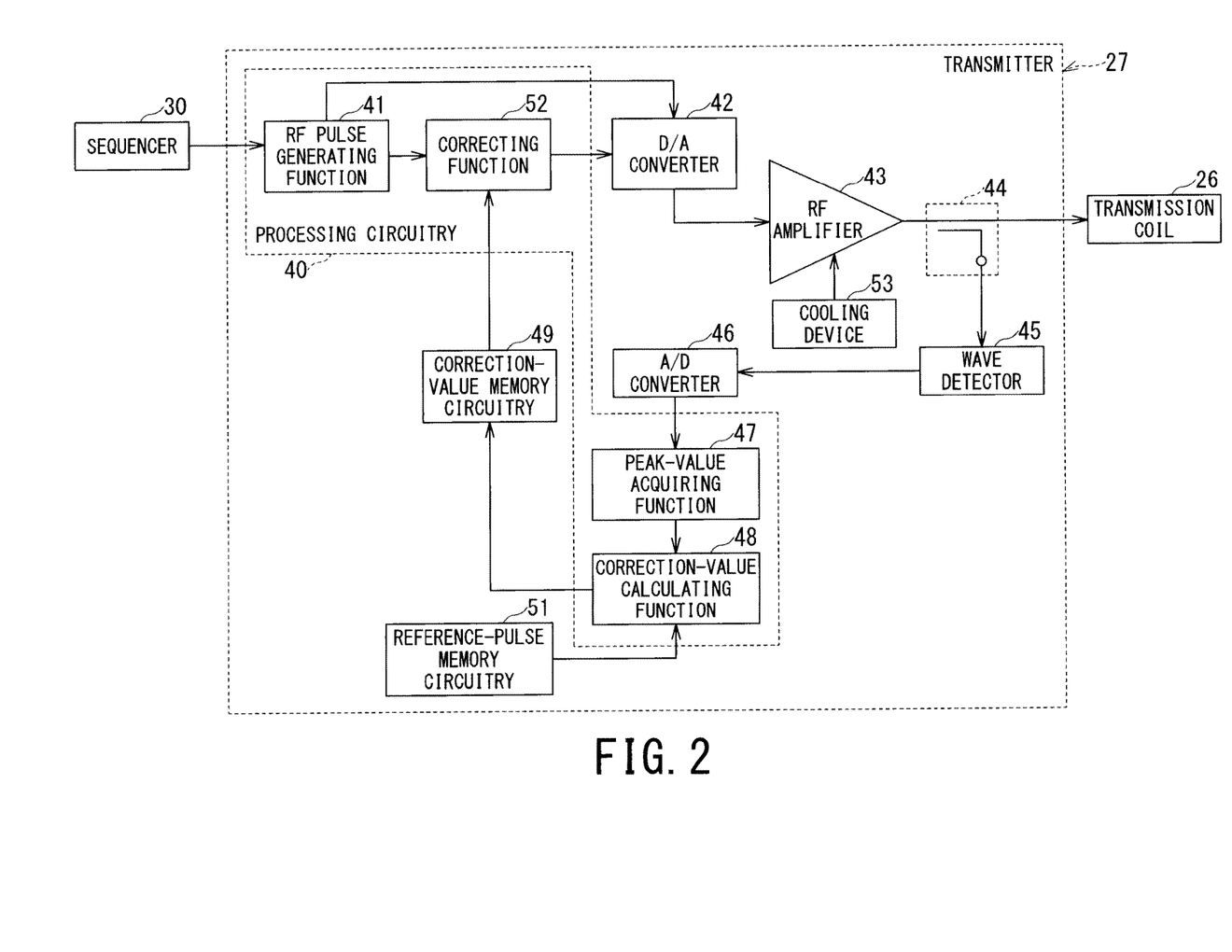
FIG. 2 is a functional block diagram mainly showing an example of functional configuration of the MRI apparatus of embodiments.

FIG. 2 is a functional block diagram showing an example of the functional configuration of the MRI apparatus 10 of embodiments of the present disclosure.

As shown in FIG. 2, the transmitter 27 of the MRI apparatus 10 includes processing circuitry 40 equipped with at least a processor and memory circuitry. The transmitter 27 amplifies RF pulses under the control of the sequencer 30, and outputs the amplified RF pulses to the transmission coil 26. The transmitter 27 includes a D/A (digital/analogue) converter 42, an RF amplifier 43, a directional coupler 44, a wave detector 45, an A/D (analogue/digital) converter 46, a cooling device 53, correction-value memory circuitry 49, reference-pulse memory circuitry 51, and the processing circuitry 40 which has an RF pulse generating function 41, a correcting function 52, a peak-value acquiring function 47, and a correction-value calculating function 48.

The processing circuitry 40 functions at least as the RF pulse generating function 41, the peak-value acquiring function 47, the correction-value calculating function 48, and the correcting function 52, by making its processer executing programs stored in its memory circuitry. Each of these functions is stored in the memory circuitry in the form of program.

The RF pulse generating function 41 time-sequentially generates the first RF pulses comprising pulse train defined in a pulse sequence. Alternatively, the RF pulse generating function 41 repeatedly generates the first RF pulses of different output values. For example, the RF pulse generating function 41 generates a pulse train comprising the first RF pulses including RF pulses having the first output value and RF pulses having the second output value. The RF pulse generating function 41 generates an RF pulse used for reference before frequency conversion (the first RF pulse), under the control of the sequencer 30.

The pulse-sequence execution data stored in the sequencer 30 are time charts of imaging and includes information such as output timing and intensity of RF pulses etc. The first RF pulse generated by the RF pulse generating function 41 is, for example, a signal whose envelope is a sinc function. The first RF pulses time-sequentially generated by the RF pulse generating function 41 will be described below.

The D/A converter 42 converts the first RF pulses generated by the RF pulse generating function 41 into analogue signals. The first RF pulses are converted into analogue signals of the Larmor frequency by the D/A converter, and then amplified by the RF amplifier 43.

The RF amplifier 43 amplifies the first RF pulses and outputs the second RF pulses. The RF amplifier 43 amplifies each first RF pulse to a desired electric power level. The RF amplifier 43 processes signals of large electric power and has large amount of heat generation. Thus, the RF amplifier 43 includes the cooling device 53 which operates based on air cooling, water cooling, etc. However, because the cooling device 53 of the RF amplifier 43 operates when the temperature inside the RF amplifier 43 exceeds a predetermined temperature, the temperature inside RF amplifier 43 fluctuates between an upper limit value and lower limit value both of which are set as threshold values. Therefore, intensity of RF pulses outputted from the RF amplifier 43 fluctuates depending on the temperature fluctuation of the RF amplifier 43.

The directional coupler 44 is a high frequency device interposed between the RF amplifier 43 and the transmission coil 26. The directional coupler 44 extracts the second RF pulse transmitted from the amplifier 43 to the transmission RF coil 26 by attenuating it with a required coupling degree (coupling coefficient), and transmits the extracted second RF pulse to the wave detector 45.

The wave detector 45 detects the second RF pulse transmitted to the transmission coil 26, and outputs the detected second RF pulse.

The A/D converter 46 digitizes the second RF pulse detected by the wave detector 45.

The peak-value acquiring function 47 acquires the peak output value of the second RF pulse.

The correction-value calculating function 48 determines the peak output value corresponding to a predetermined reference pulse as the reference peak output value (reference output value), and calculates a correction value based on difference between the reference peak output value and the peak output value of the second RF pulse, each time an amplified RF pulse is outputted from the amplifier 43. As to the method of calculating the correction value by the correction-value calculating function 48, it will be described below.

The correction-value memory circuitry 49 stores the correction values calculated by the correction-value calculating function 48. Further, the correction-value memory circuitry 49 stores the correction value calculated for each of a plurality of different output values. As to the correction values stored in the correction-value memory circuitry 49, it will be described below.

The reference-pulse memory circuitry 51 preliminarily stores the peak output value of the reference RF pulse. In addition, the reference-pulse memory circuitry 51 stores the peak output value of the reference pulse for each type of pulse sequence.

The correcting function 52 corrects output of the first RF pulse generated by the RF pulse generating function 41, by applying the correction value to each RF pulse being defined in a pulse sequence and being to be inputted to the amplifier 43 such that each RF pulse is treated as an application unit of the correction value.

(2) Operation

A method of calculating the correction value by determining one of the second RF pulses sequentially outputted from the transmitter 27 as the reference pulse and comparing the reference pulse with each of the second RF pulses outputted after the reference pulse is assumed to be the first embodiment. Another method of calculating the correction value by preliminarily storing the reference pulse and comparing the stored reference pulse with each of the second RF pulses is assumed to be the second embodiment.

Under the above assumption, the operation of the MRI apparatus 10 will be explained as follows.

The First Embodiment

The first embodiment relates to the method of calculating the correction value by determining one of the second RF pulses sequentially outputted from the transmitter 27 as the reference pulse and comparing the reference pulse with each of the second RF pulses outputted after the reference pulse. Because the correction value can be calculated by comparing the output value of the second RF pulse with the reference output value corresponding to the reference pulse, it is not necessarily needed to define the reference pulse and it is not needed to use the entire waveform of the reference pulse.

Figure 3:
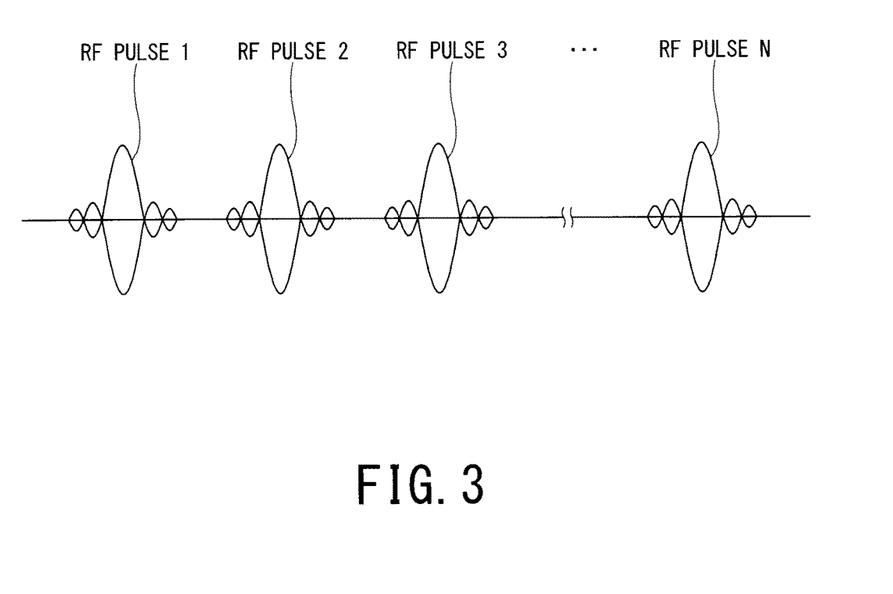
FIG. 3 is a pulse chart explaining the first transmission order of RF pulses in the first embodiment.

FIG. 3 is a pulse chart explaining the first transmission order of RF pulses in the first embodiment. FIG. 3 shows an example in which RF pulses of the same intensity are transmitted in succession. FIG. 3 shows an example in which RF pulses are transmitted in the order of the RF pulse 1, the RF pulse 2, the RF pulse 3, . . . the RF pulse N from the left to the right in FIG. 3 and an RF pulse is transmitted N times. The RF pulses are outputted at predetermined intervals defined in the pulse-sequence execution data.

Hereinafter, operation of the first embodiment will be explained based on the output order of the RF pulses shown in FIG. 3.

Figure 4:
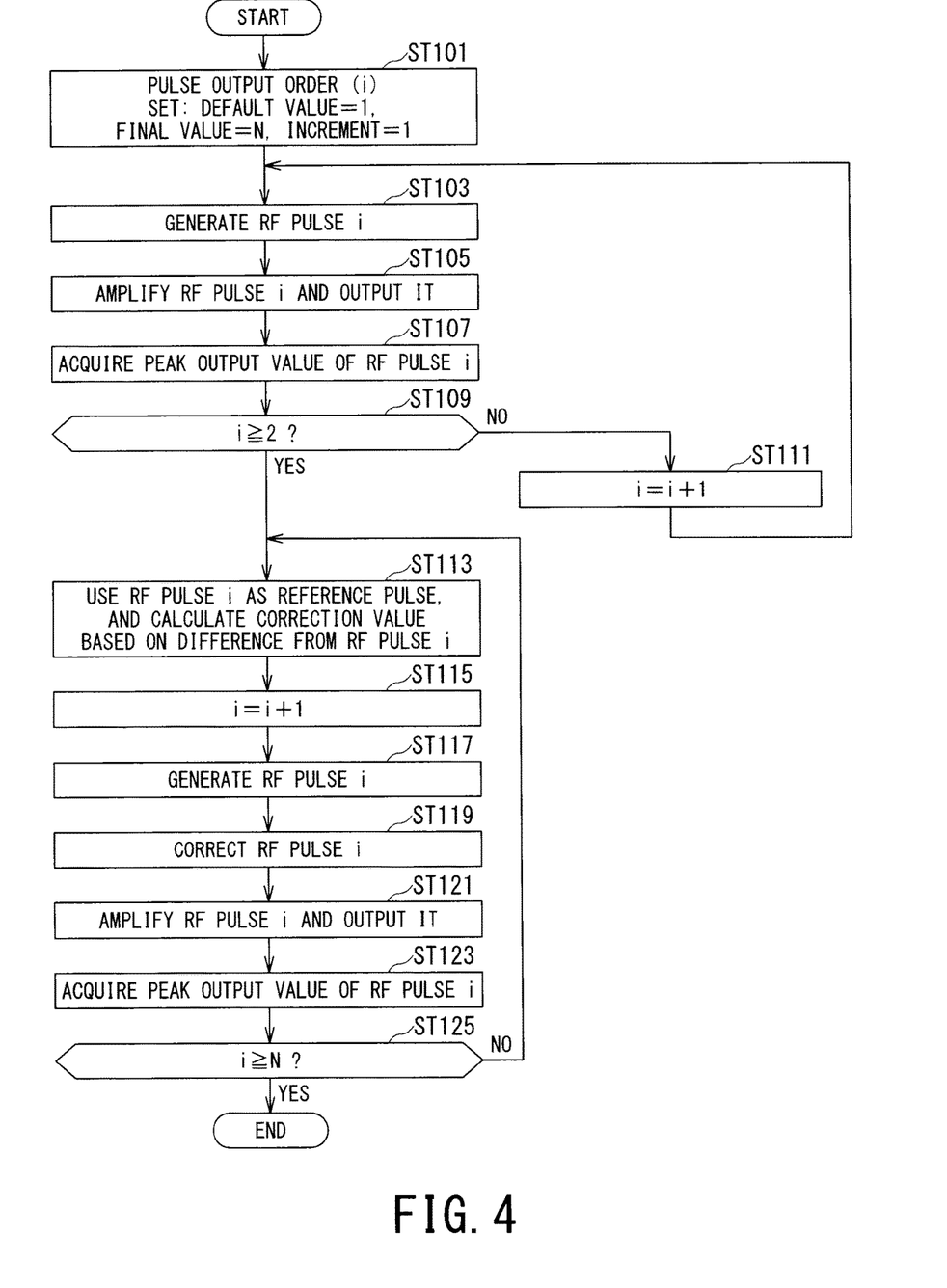
FIG. 4 is a flowchart showing an example of operation of the MRI apparatus in the first embodiment.

FIG. 4 is a flowchart showing an example of operation of the MRI apparatus 10 in the first embodiment.

In the step ST101, the sequencer 30 acquires the pulse output order from the pulse-sequence execution data. When RF pulses are time-sequentially outputted N times as shown in FIG. 3, the pulse output order i increases one by one under the assumption that the default value and the final value of the pulse output order i are 1 and N, respectively.

In the step ST103, the RF pulse generating function 41 generates an RF pulse.

In the step ST105, the RF amplifier 43 amplifies the RF pulse and outputs the amplified RF pulse to the transmission coil 26.

In the step ST107, the peak-value acquiring function 47 acquires the peak output value of the transmitted RF pulse.

In the step ST109, the correction-value calculating function 48 determines whether or not the RF pulse have been transmitted at least two times.

For example, when the number of peak values acquired by the peak-value acquiring function 47 is two or more, the correction-value calculating function 48 determines that two or more RF pulses have been transmitted. When it is determined that two or more RF pulses have been transmitted (YES in the step ST109), the processing proceeds to the step ST113 and the correction value is calculated from the step ST113.

Meanwhile, when it is determined that the RF pulse has not been transmitted two times or more (NO in the step ST109), the processing returns to the step ST103 via the step ST111 and the RF pulse of the next order is generated in the step ST103.

In the step ST111, the correction-value calculating function 48 calculates the correction value by calculating the difference between the peak output value of the reference pulse and the peak output value of the RF pulse transmitted after the reference pulse, under the assumption that the initially transmitted RF pulse is the reference pulse.

It will be explained more specifically with reference to the example shown in FIG. 3. When the RF pulse 1 is transmitted, the peak-value acquiring function 47 acquires the peak output value 1. Because only the peak output value 1 exists in memory circuitry as to the peak output value, the correction-value calculating function 48 does not calculate the correction value (NO in the step ST109). When the RF pulse 2 of the next order is transmitted, the peak-value acquiring function 47 acquires the peak output value 2. In this case, because the peak output value 1 of the RF pulse 1 and the peak output value 2 of the RF pulse 2 exist (YES in the step ST109), the correction-value calculating function 48 can calculate the correction value.

For example, assuming that the peak output value 1 of the RF pulse 1 is A1 and the peak output value 2 of the RF pulse 2 is A2, the correction value C is calculated by the following formula.

$$\text{correction value } C = A1/A2 \quad (1)$$

By multiplying the RF pulse by the correction value obtained under the above formula (1), the amplitude (peak value) can be corrected. After the correction value is calculated by the correction-value calculating function 48, correction of the RF pulse to be generated next is performed based on the calculated correction value.

In the step ST115, the sequencer 30 outputs a command to generate the RF pulse of the next order (i+1) to the RF pulse generating function 41. In the example of FIG. 3, the RF pulse 3 is outputted.

In the step ST117, the RF pulse generating function 41 generates the RF pulse.

In the step ST119, the correcting function 52 corrects the RF pulse generated by the RF pulse generating function 41 in the step ST117.

In the step ST121, the RF amplifier 43 amplifies the corrected RF pulse and outputs the amplified RF pulse to the transmission coil 26.

In the step ST123, the peak-value acquiring function 47 acquires the peak output value of the RF pulse transmitted in the step 121.

In the step ST125, the sequencer 30 determines whether all the RF pulses defined in the pulse-sequence execution data have been transmitted or not. When transmission of all the defined RF pulses is not completed (NO in the step ST125), the correction value is calculated based on the difference between the peak output value of the reference pulse and the newly acquired peak output value (in the step ST113). As an concrete example, the correction value is calculated based on the difference between the peak output value of the RF pulse 3 in FIG. 3 and the peak output value of the RF pulse 1 determined as the reference pulse. Meanwhile, when transmission of all the defined RF pulses is completed (YES in the step ST125), in other words, when transmission of the RF pulses up to the RF pulse N in the example of FIG. 3 is completed, the operation of the first embodiment is completed.

As explained above, by defining one already outputted RF pulse (the RF pulse 1 in the example of FIG. 3) as the reference pulse, the RF pulse to be newly outputted is corrected by using the correction value calculated based on comparison between the peak output value of the reference pulse and the peak output value of each RF pulse outputted after the reference pulse.

As shown in FIG. 4, the correction value may be promptly applied to an RF pulse which is included in an RF pulse train, and which is generated after the RF pulse corresponding to the pulse used for calculation of correction value, i.e., has not been inputted to the RF amplifier 43 yet. In addition, the correction value may be promptly applied to an RF pulse included in the TR (repetition time) subsequent to the TR including the RF pulse used for calculation of the correction value.

As mentioned above, fluctuation of output of RF pulses subsequent to the reference pulse due to gain fluctuation caused by the temperature fluctuation of the RF amplifier 43 can be suppressed by correcting the RF pulses to be outputted based on the reference pulse. Thereby, an RF pulse can be transmitted with desired output level. Further, because RF pulses can be uniformly outputted with the same intensity as the reference pulse, variation in RF pulse intensity is reduced and artifact of acquired images can be prevented.

In the example of the flowchart in FIG. 4, the case has been explained in which the reference output value is set when the reference pulse is set for each pulse sequence and each pulse sequence is determined for each imaging protocol. However, the setting method of the reference output value is not limited to setting it for each pulse sequence. One examination may be composed of a plurality of imaging protocols and a plurality of pulse sequences is performed, and the reference output value may be set for each examination. Further, the reference output value may be set for each object, or the reference output value may be updated at predetermined intervals. Further, the reference output value may be updated for each predetermined period during implementation of a pulse sequence. In addition, when a pulse sequence is defined to repeat a plurality of repetition times, the reference output value may be updated for each repetition time in the pulse sequence.

An example in which the first leading RF pulse in the RF pulse train in FIG. 4 is defined as the reference pulse and its output value is defined as the reference output value has been explained. However, the reference pulse and the RF pulse for calculating the first correction value may be outputted as pulses for correction which are not used for imaging. By using only RF pulses having subjected to correction, images can be obtained by outputting more stable RF pulses.

In FIG. 3 and FIG. 4, a case where only one type of RF pulse is outputted has been explained. However, RF pulses of a plurality of intensity values in which the first RF pulse of the first output value and the first RF pulse of the second output value are included are transmitted in some cases depending on an imaging protocol. For example, in an SE (spin echo) technique, RF pulses of two intensity values including 90° excitation pulses and 180° refocusing pulses are used. In such a pulse sequence, RF pulses of each intensity value are corrected in the above-mentioned manner.

Figure 5:
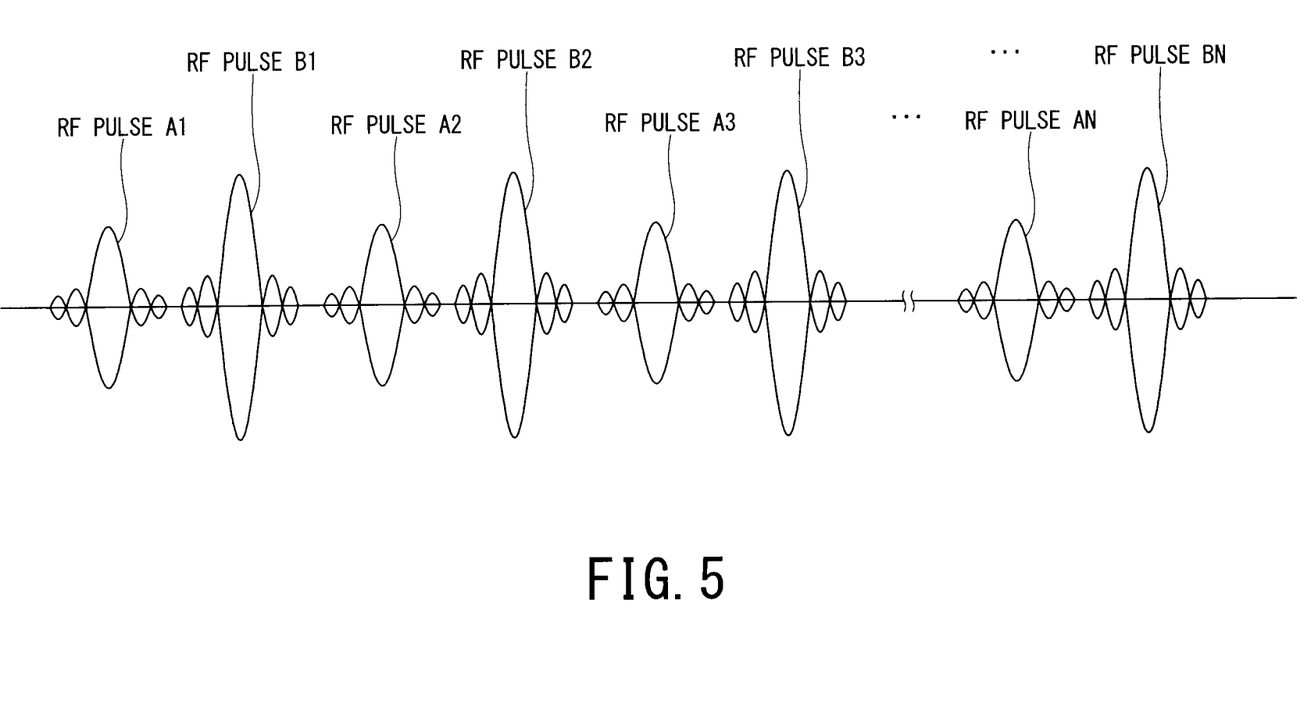
FIG. 5 is a pulse chart explaining the second transmission order of RF pulses in the first embodiment.

FIG. 5 is a pulse chart explaining the second transmission order of RF pulses according to the first embodiment. It shows an example in which two types of RF pulses, the RF pulse A and the RF pulse B, are alternately transmitted in order from the left to the right in FIG. 5. For example, this pulse chart is applicable to a case where RF pulses of two intensity values including 90° excitation pulses and 180° refocusing pulses are transmitted.

FIG. 5 shows an example in which the RF pulse A1, the RF pulse B1, the RF pulse A2, the RF pulse B2, the RF pulse A3, the RF pulse B3, . . . the RF pulse AN, the RF pulse BN are time-sequentially transmitted from the left to the right of the figure. The RF pulses A corresponding to the first RF pulse of the first output value and the RF pulses B corresponding to the first RF pulse of the second output value each are transmitted N times.

When RF pulses of different intensities, i.e. a plural types of RF pulses, are transmitted like shown in FIG. 5, the peak value is acquired for each RF pulse and the reference pulse is set for each type of RF pulse, and then the correction values are calculated for each type of RF pulse. To put it more concretely using the example of FIG. 5, the RF pulse A1 and the RF pulse B1 are set as the reference pulse for the RF pulses A and the reference pulse for the RF pulses B, respectively. The correction value CA1 is calculated by comparing the peak output value of the RF pulse A2 outputted subsequent to the reference pulse with the peak output value (first reference output value) of the reference pulse (RF pulse A1). Similarly, the correction value CB1 is calculated by comparing the peak output value of the RF pulse B2 with the peak output value (second reference output value) of the reference pulse (RF pulse B1). The RF pulse A3 is corrected by using the calculated correction value CA1, and the RF pulse B3 is corrected by using the calculated correction value CB1.

As mentioned above, the correction values for the pulses of the respective intensity values are calculated by comparing the outputted pulse and the reference pulse each having the same intensity value, and the pulse of the same intensity value to be newly outputted is corrected by the corresponding correction value.

An example of a case where the correction-value calculating function 48 can distinguish pulse types such as a 90° excitation pulse and a 180° refocusing pulse based on difference in pulse intensity has been shown in FIG. 5. However, even if pulse types are different from each other, there are some cases where different types of RF pulses with mutually close intensity are outputted and the correction-value calculating function 48 cannot determine the pulse type only by its peak output value. Meanwhile, outputted pulse intensity and output timing can be determined by using the pulse-sequence execution data stored in the sequencer 30. Further, the individual pulses can be distinguished from each other without using the pulse-sequence execution data, if a user inputs the number of pulse types and their output order via the input circuit 36 as an example. As mentioned above, the correction-value calculating function 48 may be configured to calculate the correction value only when the correction-value calculating function 48 can distinguish each pulse. In addition, the correcting function 52 may be configured not to perform the correction processing in order to avoid erroneous correction, when the individual pulses cannot be distinguished from each other.

The correcting function 52 may be configured not to perform the correction processing in at least one of (a) the case where the output interval of RF pulses is shorter than the first period and (b) the case where the output interval of RF pulses is longer than the second period which is longer than the first period. This is because there is a possibility of oscillation of an RF pulse caused by the correction processing.

For example, if the output interval of RF pulses is too long, there are some cases where the situation has been changed from the timing when the correction value is calculated to the timing of outputting the RF pulse of the correction target. For example, if RF pulse intensity has not been sufficiently amplified by the RF amplifier 43 and intensity of this RF pulse is smaller than intensity of the reference pulse, the correction value is set such that the intensity of the RF pulse of the correction target increases. When the intensity of the RF pulse of the correction target to be outputted next is amplified by the RF amplifier 43 with a gain larger than the intended gain, the RF pulse of the correction target is outputted with intensity considerably larger than the intended intensity. If such correction is repeated, intensity of each of the outputted RF pulses gradually increases and finally, oscillation occurs.

In addition, if the output interval of RF pulses is too short, there is a possibility that a fluctuation direction of an RF pulse is brought to a direction opposite to a correction direction and RF pulses oscillate.

For the above reasons, the correcting function 52 may be configured not to execute the correction processing in at least one of (a) the case where the output interval of RF pulses is shorter than the first period and (b) the case where the output interval of RF pulses is longer than the second period which is longer than the first period.

As explained above, the feedback control, in which intensity of RF pulse is not influenced by the temperature of the RF amplifier 43 changing moment by moment, can be achieved by calculating the correction value based on intensity of each RF pulse transmitted to the transmission coil 26 and correcting each RF pulse inputted to the RF amplifier 43.

The Second Embodiment

The second embodiment relates to the method of calculating the correction value by preliminarily storing the reference pulse and comparing the stored reference pulse with each outputted second RF pulse.

Figure 6:
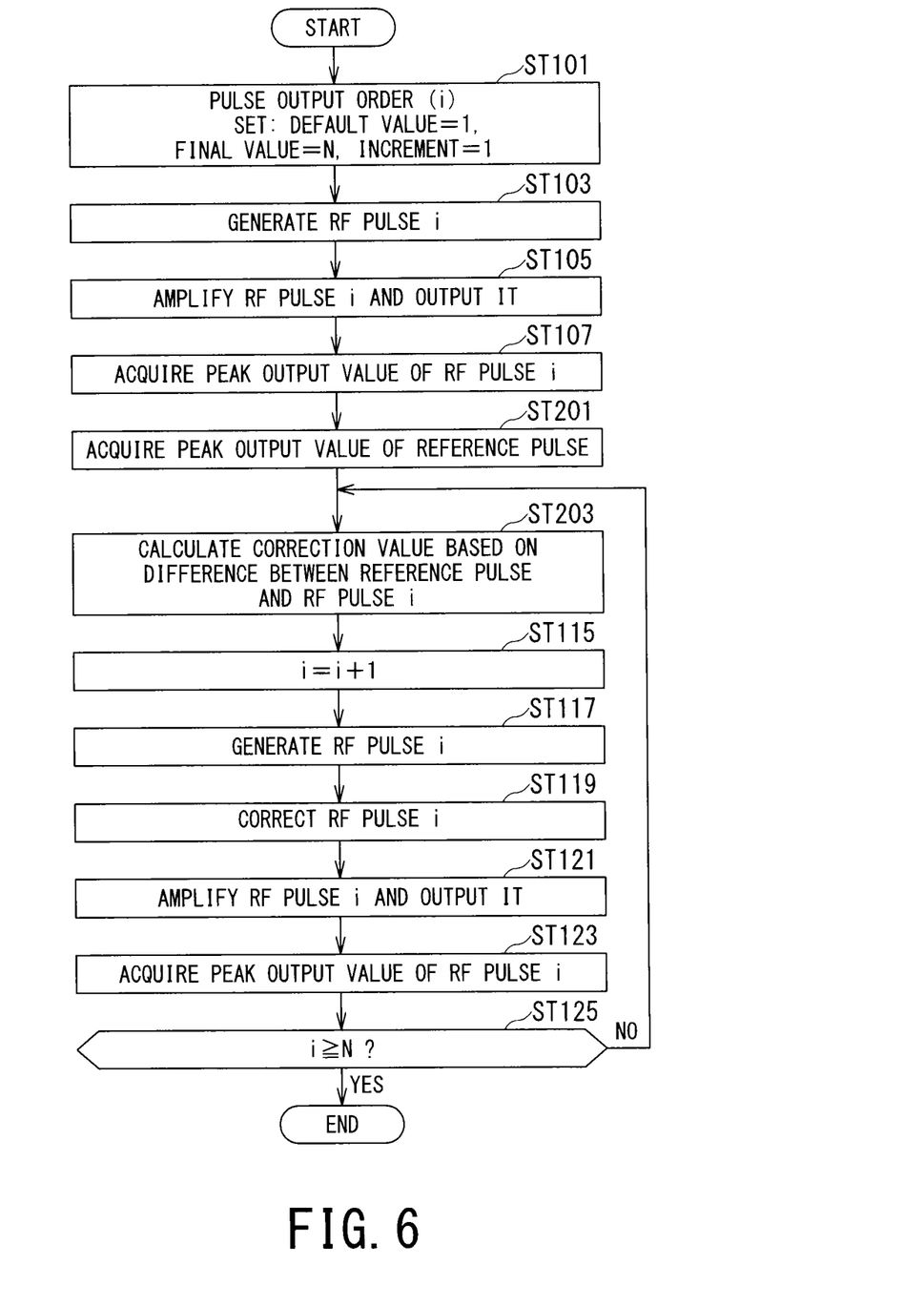
FIG. 6 is a flowchart showing an example of operation of the MRI apparatus in the second embodiment.

FIG. 6 is a flowchart showing an example of operation of the MRI apparatus 10 in the second embodiment. The same reference numbers are given for the identical processings as the processings in the flowchart of FIG. 4, and duplicate explanation is omitted.

In the step ST201, the correction-value calculating function 48 of the processing circuitry 40 acquires the peak output value of the reference pulse from the reference-pulse memory circuitry 51. The peak output value of the reference pulse is, for example, an estimated value calculated based on RF pulse intensity defined in the pulse-sequence execution data etc.

In the step ST203, the correcting function 52 calculates the correction value based on difference between the peak output value of the reference pulse and the peak output value of the RF pulse transmitted to the transmission coil 26.

For example, when RF pulses are outputted like FIG. 3, the initial correction value can be calculated based on the peak output value of the reference pulse and the peak output value of the RF pulse 1. In this case with the MRI apparatus 10 according to the first embodiment, therefore, the intensity value of the RF pulse outputted for the first time is an abnormal value, the subsequent correction processing is performed based on the abnormal value and it is not appropriate. In this respect, because the reference pulse is preliminarily stored in the second embodiment, a value acquired under normal conditions can be easily set as the reference pulse, thereby preventing erroneous correction from occurring.

Further, when RF pulses of different intensities are outputted like shown in FIG. 5, those RF pulses can be corrected by (a) storing the reference pulses of the respective intensity values or (b) storing the respective reference output values themselves (for example, the first reference output value and the second reference output value). Moreover, because RF pulses to be used are different for each imaging protocol, the reference pulse may be stored in accordance with the pulse-sequence execution data defined for each imaging protocol.

The correction values calculated in the first embodiment and/or the second embodiment may be stored in the correction-value memory circuitry 49.

Figure 7:
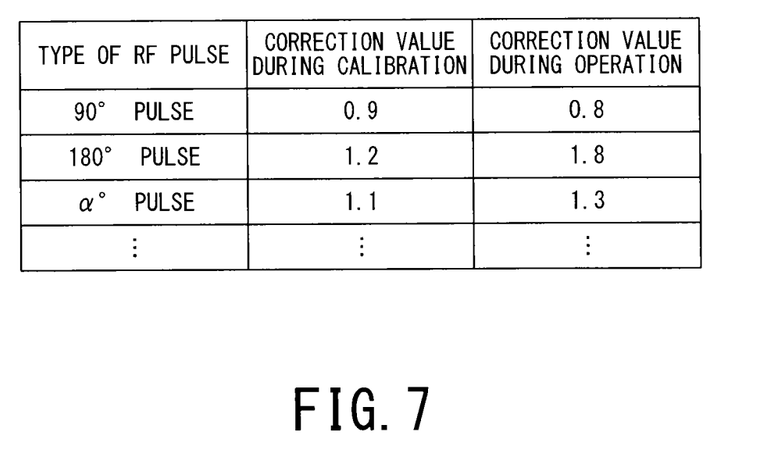
FIG. 7 is a chart explaining a correction value table in the first embodiment.

FIG. 7 is a chart explaining the correction value table in the first embodiment. In FIG. 7, the correction values during calibration and the correction values during operation are stored for each of the RF pulses of different intensity. The correction value during calibration is a gain determined by automatic power control performed before examination. The correction value during operation is the correction value calculated in the above-mentioned embodiment.

When the type of RF pulse is a 90° pulse, the correction value during calibration is 0.9 and the correction value during operation is 0.8 in the example of FIG. 7. Similarly, when the type of RF pulse is a 180° pulse, the correction value during calibration is 1.2 and the correction value during operation is 1.8. When the type of RF pulse is a $\alpha°$ pulse, the correction value during calibration is 1.1 and the correction value during operation is 1.3.

A standard gain is preliminarily set or stored for each type of RF pulse, and RF pulses are corrected by the automatic power control performed before examination. Each RF pulse subjected to the automatic power control is further corrected by the correction value during operation, when the correction value is calculated in the method of the present embodiment. The standard gain for each type of RF pulse may be set for each pulse type, or may be set on the basis of pulse types. Such setting for each pulse type may be preliminarily performed for each MRI apparatus 10. Alternatively, such setting for each pulse type may be performed based on measurement results measured by the MRI apparatus 10 at the time of its installation.

The correction-value memory circuitry 49 may update the correction value, each time the correction value is calculated by the correction-value calculating function 48. Alternatively, the correction-value memory circuitry 49 may store all the calculated correction values.

By storing the correction values in such a manner, for example, the correction values can be used for calculating estimated value of the reference pulse used in the second embodiment. In addition, by continuously accumulating data of the correction values, the data can be also used for inspection of the cooling device 53 of the RF amplifier 43. The correction values acquired in the above manner are information obtained from outside of the cooling device 53 of the RF amplifier 43, and are values which are not influenced by the cooling device 53. Thus, even if abnormality cannot be detected only from information acquired by the cooling device 53 itself, detection of abnormality is enabled by analyzing the transition of the correction values.

According to the MRI apparatus of at least one of the above-mentioned embodiments, an RF pulse can be outputted with desired intensity.

Note that the term "processor" regarding the processing circuitry 40 of the transmitter 27, the sequencer 30, and the general control circuit 37 means, for instance, a circuit such as a dedicated or general-purpose CPU (Central Processing Unit), a dedicated or general-purpose GPU (Graphics Processing Unit), an ASIC (Application Specific Integrated Circuit), a programmable logic device including an SPLD (Simple Programmable Logic Device) and a CPLD (Complex Programmable Logic Device) as examples, an FPGA (Field Programmable Gate Array), and so on. A processor achieves various types of functions by reading out programs stored in memory circuitry and implementing the programs.

In addition, programs may be directly installed in the circuit of a processor instead of storing programs in the memory circuitry. In this case, the processor achieves various types of functions by reading out programs stored in its own circuit and implementing the programs.

Although a case where the unified processing circuitry 40 achieves each function has been explained above, this is only an example. As another example, the processing circuitry 40 may be configured by combining a plurality of mutually independent processors so that each function is achieved by each processor that executes the corresponding program.

When a plurality of processors are used, a memory medium for storing programs may be disposed for each processer, or a single memory circuitry may collectively store the programs corresponding to the functions of all the processors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An MRI apparatus comprising:
a generator configured to sequentially generate RF pulses comprising an RF pulse train defined in a pulse sequence;
an amplifier configured to amplify the RF pulses sequentially inputted from the generator; and
processing circuitry configured to
calculate a correction value, each time an amplified RF pulse is outputted from the amplifier, based on a difference between an output value of the amplified RF pulse and an output value of a predetermined reference RF pulse, and
apply the correction value promptly to an RF pulse to be inputted to the amplifier, the RF pulse to be inputted to the amplifier being included in the RF pulse train and being generated after an RF pulse corresponding to the amplified RF pulse used for calculation of the correction value is generated.

2. The MRI apparatus according to claim 1, wherein the processing circuitry is configured to treat each RF pulse defined in the pulse sequence as an application unit of the correction value.

3. The MRI apparatus according to claim 1, wherein the processing circuitry is configured to apply the correction value promptly to an RF pulse included in a repetition time subsequent to a repetition time including an RF pulse used for calculation of the correction value.

4. The MRI apparatus according to claim 1, wherein the processing circuitry is configured to set an output value of a leading RF pulse of the RF pulse train as the output value of the predetermined reference RF pulse.

5. The MRI apparatus according to claim 1, wherein the processing circuitry is configured to update the output value of the predetermined reference RF pulse for each predetermined period during implementation of the pulse sequence.

6. The MRI apparatus according to claim 5, wherein the processing circuitry is configured to update the output value of the predetermined reference RF pulse for each repetition time when a plurality of repetition times is included in the pulse sequence.

7. The MRI apparatus according to claim 1, wherein the processing circuitry is configured to calculate the correction value, each time the amplified RF pulse is outputted from the amplifier, based on a difference between a peak output value of the amplified RF pulse and a reference peak output value.

8. The MRI apparatus according to claim 1, wherein the processing circuitry is configured to set one of amplified RF pulses outputted from the amplifier as a reference pulse, and to calculate the correction value based on a difference between the output value of the predetermined reference RF pulse and the output value of the amplified RF pulse outputted posterior to the reference pulse from the amplifier.

9. The MRI apparatus according to claim 1, further comprising memory circuitry configured to preliminarily store the output value of the predetermined reference RF pulse, wherein
the processing circuitry is configured to calculate the correction value based on a difference between the output value of the amplified RF pulse and the output value of the predetermined reference RF pulse stored in the memory circuitry.

10. The MRI apparatus according to claim 9, wherein the memory circuitry is configured to store the output value of the predetermined reference RF pulse for a type of the pulse sequence.

11. The MRI apparatus according to claim 1, wherein the generator is configured to generate the RF pulse train including a plurality of RF pulses each having a first output value and a plurality of RF pulses each having a second output value and to input the RF pulse train to the amplifier, and
the processing circuitry is configured to
set a first reference output value corresponding to the first output value and a second reference output value corresponding to the second output value,
calculate a first correction value based on a difference between an output value of the amplified RF pulse corresponding to an RF pulse having the first output value and the first reference output value,
apply the first correction value to an RF pulse having the first output value to be inputted to the amplifier, that is included in the RF pulse train and is generated after the RF pulse having the first output value corresponding to the amplified RF pulse used for calculation of the first correction value is generated,
calculate a second correction value based on a difference between an output value of the amplified RF pulse corresponding to an RF pulse having the second output value and the second reference output value,
apply the second correction value to an RF pulse having the second output value to be inputted to the amplifier, that is included in the RF pulse train and is generated after the RF pulse having the second output value corresponding to the amplified RF pulse used for calculation of the second correction value is generated.

12. The MRI apparatus according to claim 11, wherein the processing circuitry is configured to set a first one of the output values of amplified RF pulses corresponding to an RF pulse having the first output value as the first reference output value, and to set a second one of the output values of amplified RF pulses corresponding to an RF pulse of the second output value as the second reference output value.

13. The MRI apparatus according to claim 11, further comprising memory circuitry configured to preliminarily store the first reference output value and the second reference output value, wherein
the processing circuitry is configured to use the first reference output value and the second reference output value stored in the memory circuitry for calculation of the first correction value and the second correction value respectively.

14. The MRI apparatus according to claim 11, further comprising memory circuitry configured to store the first correction value corresponding to an RF pulse having the first output value and the second correction value corresponding to an RF pulse having the second output value.

15. The MRI apparatus according to claim 1, wherein
the processing circuitry is configured to set the output value of the predetermined reference RF pulse for each period, the period being at least one of a period of one examination including a plurality of imaging protocols, a period of an imaging protocol, and a period of each repetition time of a plurality of repetition times included in an imaging protocol.

16. The MRI apparatus according to claim 1, further comprising memory circuitry configured to store the correction value calculated by the processing circuitry, wherein
the processing circuitry is configured to update the correction value stored in the memory circuitry each time the processing circuitry calculates the correction value.

17. The MRI apparatus according to claim 1, wherein
the processing circuitry is configured not to apply the correction value to an RF pulse to be inputted to the amplifier in at least one of a case where an output interval between two RF pulses sequentially outputted from the amplifier is shorter than a first period and a case where the output interval is longer than a second period which is longer than the first period.

* * * * *